United States Patent [19]

Tsukagoshi et al.

[11] Patent Number: 4,731,282

[45] Date of Patent: Mar. 15, 1988

[54] ANISOTROPIC-ELECTROCONDUCTIVE ADHESIVE FILM

[75] Inventors: Isao Tsukagoshi, Shimodate; Yutaka Yamaguchi, Yuuki; Tadamitsu Nakayama, Yokohama, all of Japan

[73] Assignee: Hitachi Chemical Co., Ltd., Japan

[21] Appl. No.: 854,808

[22] Filed: Apr. 23, 1986

Related U.S. Application Data

[63] Continuation of Ser. No. 660,229, Oct. 12, 1984, abandoned.

[30] Foreign Application Priority Data

Oct. 14, 1983 [JP] Japan .................................. 58-193237
Dec. 15, 1983 [JP] Japan .................................. 58-236883

[51] Int. Cl.$^4$ ........................... B32B 5/16; C09J 7/02
[52] U.S. Cl. ........................... 428/220; 427/207.1; 428/323; 428/325; 428/327; 428/328; 428/343; 428/901; 428/929
[58] Field of Search ............... 102/468; 428/335, 901, 428/929, 560, 343, 329, 220, 323, 325, 327, 328; 427/207.1

[56] References Cited

U.S. PATENT DOCUMENTS

| | | | |
|---|---|---|---|
| 2,748,701 | 6/1956 | Barrows | 102/468 |
| 2,808,352 | 10/1957 | Coleman et al. | 428/560 |
| 3,514,326 | 5/1970 | Storm | 427/207.1 |
| 3,778,306 | 12/1973 | Storm | 428/335 |
| 4,448,837 | 5/1984 | Ikeda et al. | 428/329 X |

*Primary Examiner*—Thomas J. Herbert
*Attorney, Agent, or Firm*—Antonelli, Terry & Wands

[57] ABSTRACT

An anisotropic-electroconductive adhesive film containing a small quantity of electroconductive particles having a special shape in an adhesive component layer which has a limited thickness is useful for connecting micro-sized circuits, etc. due to its anisotropy in electroconductivity and good transparency.

10 Claims, 2 Drawing Figures

ANISOTROPIC-ELECTROCONDUCTIVE ADHESIVE FILM

This is a continuation of application Ser. No. 660,229, filed Oct. 12, 1984, now abandoned.

BACKGROUND OF THE INVENTION

The present invention relates to an anisotropicelectroconductive adhesive film which is electrically conductive only in the direction perpendicular to the surface thereof and not in any direction parallel to the surface.

Solders and electroconductive adhesives have so far been used widely as means of connecting large scale integrated circuits (LSI) or electrodes of liquid crystal display elements (LCD) to printed circuit boards and of bonding flexible flat cables (FFC) to external connecting terminals of various devices.

However, with the miniaturization of electronic parts and the size reduction of connecting circuits, it has become extremely difficult to connect circuits to one another without causing short circuit between neighboring parts of the circuits in particular when connecting terminals or the like are aligned at fine pitches.

In addition, soldering has a drawback of low reliability in adhesion due to hard and brittle properties thereof, that is, the liability of bonded parts to be readily separated by a shock or the like.

Electroconductive adhesives, on the other hand, are expensive because electroconductive fillers need to be incorporated to high concentrations of at least 20% by volume into adhesives in order to obtain necessary conductivity. Further, drawbacks of conductive adhesives are that variation in the conductivity is caused by such a factor as the precipitation of the filler during storage or difficulty in uniform coating thereof and that environmental pollution due to the contained organic solvent may occur.

An example of the attempts to eliminate these drawbacks is the method disclosed in Japanese Patent Application Kokai (Laid-Open) No. 147,732/78, which comprises applying a conductive adhesive prepared by incorporating 5 to 25% by weight of an electroconductive carbon black as an electroconductive filler into a heat-sensitive adhesive and conducting an electric current through the layer of the applied adhesive to generate Joule's heat, thereby completing bonding.

According to this method, however, the upper limit of the electroconductivity is $10^\circ \ \Omega-cm^{-1}$, the appearance is black in color, and the transparency is lost completely, since carbon is used as the electroconductive filler. Moreover, the bonding operation requires a long time ranging from 10 minutes to 10 hours and the workability is inferior, since the adhesion is achieved with Joule's heat.

Adhesive tapes having electroconductive anisotropy are also known which are prepared by dispersing metal particles as electroconductive filler particles in a polymer binder (Japanese Patent Application Kokai (Laid-Open) No. 101040/76). Such adhesive tapes, however, are inferior in adhesive properties and transparency, since conductive fillers such as metal particles need to be incorporated in large quantities of at least 10% by volume in order to secure the necessary electroconductivity.

Further, for circuit connecting purposes, there are used in practice connecting materials having anisotropic-electroconductivity which materials are produced by linear alignment of metal wires, carbon filaments, or carbon particles in polymers, for example, silicone rubber. However, these connecting materials have a number of drawbacks in that the minimum separation width of the conductors or insulators is as large as 0.2 mm at best, thus the use of these materials for connecting fine circuits is limited, compression pressure should always be applied in order to maintain the connection in a good state and this requires a special fixing means, which results in restricting equipment designs; and the materials themselves are opaque so that the adjustment of relative positions of circuits is complicated when the circuits are superposed and connected together.

SUMMARY OF THE INVENTION

Thus, an object of the present invention is to provide an anisotropic-electroconductive adhesive film which permits achieving with simple operation the electroconductive connection between two groups of connecting terminals which face each other and are each aligned at fine pitches.

According to the invention, there is provided an anisotropic-electroconductive adhesive film comprising an adhesive component and electroconductive particles, the adhesive component including 0.1 to 10% by volume of electroconductive particles having an average particle size of 1 to 50 $\mu$m with a ratio of the minimum diameter to the maximum diameter of each particle being 0.5 to 1.0, and the thickness of an adhesive layer is at least 110% of the average particle size of the electroconductive particles and not more than 100 $\mu$m.

DESCRIPTION OF THE PREFERRED EMBODIMENTS

Figure 1:
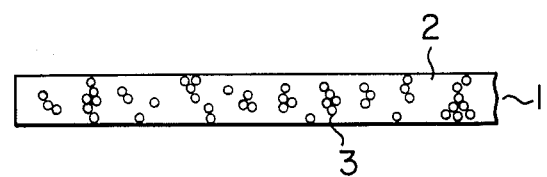
FIG. 1 is a cross-sectional view of the anisotropic-electroconductive adhesive film according to the invention.

This invention is explained in detail referring to the drawings.

FIG. 1 shows the fundamental construction of the anisotropic-electroconductive adhesive film according to the invention. As shown in FIG. 1, the adhesive film comprises an adhesive layer 2 of bonding material and electroconductive particles 3 dispersed therein. The adhesive layer 2 is an electrical insulator and has functions of holding electroconductive particles 3 in a dispersed state and adhering to a printed circuit board or the like. The layer 2 undergoes plastic deformation on applying pressure with or without heating, and this brings electroconductive particles into contact one with another along the direction of the pressure application so as to maintain electrical conductivity permanently.

Figure 2:
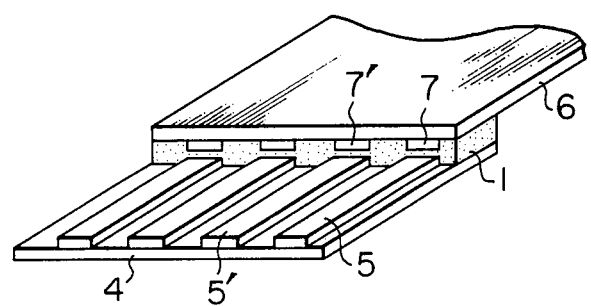
FIG. 2 is a perspective view showing the connected state of a group of connecting terminals formed on a circuit board.

FIG. 2 shows the application of the invention wherein a connecting terminal 5 of a flexible printed circuit board 4 is connected electrically with a connecting terminal 7 of a flexible flat cable 6 by using such an adhesive film as shown in FIG. 1. In this case, the opposing pairs of connecting terminals 5-7, 5'-7', . . . are each in an electrically conductive state while the communications between the neighboring terminals 5 and 5', . . . and between the neighboring terminals 7 and 7', . . . are each in an electrically insulated state.

The adhesive film according to the invention has an anisotropy in electrical conductivity between the directions perpendicular and parallel to the surface thereof (hereinafter for convenience, the direction perpendicular to the film surface is referred to as the "thickness direction" and the directions parallel to the film surface as the "plane direction"). The film has a resistivity of at least $10^6$ Ω-cm in the plane direction and a resistivity of not more than $10^3$ Ω-cm in the thickness direction, exhibiting thus a great anisotropy in resistivity. The adhesive film has a small minimum separation width of resistance both in the plane and the thickness direction, thus being good in resolution. That is, the minimum insulation width in the film plane direction is 0.05 mm. Moreover the application of the film can be accomplished under both heat-sensitive and pressure-sensitive conditions. Accordingly, the adhesive film offers good application workability and strong adhesion as well as high electrical conductivity and additionally has a considerably high transparency.

The above-mentioned features of the film are due to the high anisotropic electrical conductivity that has become obtainable by the incorporation of special electroconductive particles in small amounts and due to the arbitrary compounding enabled thereby for the film formation. Conceivably the shape of the electroconductive particles is the main cause of the fact that the film exhibits a high anisotropic conductivity with small amounts of electroconductive particles. In other words, the adhesive layer in application becomes fluid with heat or pressure and each electroconductive particle embedded in the surface layer of the film will be in one-point contact with the surface of the conductor to be bonded, so that the adhesive film sufficiently adapts itself to the adhesion surface of the conductor and provides high bond strength. Electroconductive particles in the surface layer take such configurations as to readily contact with electroconductive particles present on the deeper side, forming links in the thickness direction and as to have a little opportunity to contact with other electroconductive particles in the plane direction, whereby the anisotropic electroconductivity is obtained.

The following description refers to materials used in the invention.

The electroconductive particles used in the invention are metallic particles of 1 to 50 μm in diameter. The ratio of the smallest diameter to the largest diameter of each particle is 0.5 to 1.0. The particles are contained in the adhesive component in an amount of 0.1 to 10% by volume. The maximum particle size is desirably 1 to 50 μm, more preferably 1 to 10 μm. When it is less than 1 μm, a large amount of electroconductive particles are required, which results in deteriorating the bond strength greatly. When the maximum particle size is more than 50 μm, it is impossible to obtain a smooth adhesive surface having good affinity to an adhered from the viewpoint of thickness of the adhesive film layer, which results in failing to give sufficient adhesiveness. Further, insulating properties and resolution properties at electric conduction are also undesirably worsened.

As regards the shape of the electroconductive particles, the ratio of the smallest diameter to the largest of each particle (hereinafter referred to as "the aspect ratio") is about 0.5 to 1.0 as stated above. If the aspect ratio is out of the above range, the balance between the electroconductivity and the adhesiveness will be disturbed. A typical example of the particle shapes satisfying the above condition is spherical or nearly spherical. However, the shape is not particularly limited so long as the aspect ratio falls in the above range. The particles are allowed to have projections or depressions on the surface.

The particle size herein means the average diameter of all the particles.

The shape and diameter of the particles are conveniently measured by way of, for example, an electron microscope.

When the electroconductive particles are, for example, spherical, the adhesive layer is fluidized by the heating or pressure at the time of adhesion, which results in making it possible to contact one point of the sperical particles with the conductor surface.

In contrast to this, flaky conductive particles, for example, are aligned with longer axes thereof being directed in parallel to the adhesive surface in the steady state and the adhered surface is therefore occupied mostly with the electroconductive particles, thereby the adhesive properties are lowered to a large extent.

The electroconductive particles can be produced by any possible method from the following materials: Metals, for example, Ni, Fe, Cr, Co, AL, Sb, Mo, Cu, Ag, Pt, and Au, and alloys and oxides of these metals. The above materials may be used alone or in combination.

It is also possible to use metal-coated particles of non-conductive materials, for example, glass and plastics.

Suitable content of conductive particles in the adhesive component layer is 0.1 to 10% by volume. The thickness of the adhesive film is at least 110% of the average particle size of the electroconductive particles contained and desirably not more than 100 μm. With the particle content less than 0.1% by volume, no satisfactory electrical conductivity is obtained, and when the content exceeds 10% by volume, the bond strength much lowers and no sufficient transparency of the film is obtainable.

The following description refers to compounding for the adhesive film.

For selecting the polymer used for the adhesive, some considerations are necessary depending upon the method of applying the adhesive film, in other words, depending upon whether the film is of heat sensitive type or of pressure sensitive type. The heat sensitive type of adhesive film is applied by heating to soften and flow on the adherend surface, thereby bonding the object. For the film of heat sensitive type, a polymer relatively hard at ordinary temperatures is used. On the other hand, the pressure sensitive type of adhesive film, which is applied with pressure on an adherend, is relatively soft to such an extent that stickiness thereof is perceptible even at ordinary temperatures.

As the heat sensitive type of adhesive film, various polymers can be adapted while thermoplastic polymers that exhibit plasticity on heating are usually employed as a main component. These polymers include, for example, an ethylene-vinyl acetate copolymer, polyethylene, ethylene-propylene copolymer, ethylene-acrylate copolymer, acrylic rubber, polyisobutylene, atactic polypropylene, poly(vinyl butyral), styrene-butadiene copolymer, polybutadiene, ethylcellulose, polyamide, and polyurethane. These polymers may be used alone or as a mixture thereof.

As the pressure sensitive type of adhesive film, polymers exhibiting stickiness even at room temperature can be employed. These polymers include an acrylic rubber, natural rubber, silicone rubber, polychloroprene, butadiene-styrene copolymer, ethylene-vinyl acetate copolymer, polyisobutylene, and poly(vinyl ether) rubber. These polymers also may be used alone or as a mixture thereof.

In addition to these polymers, tackifiers and conventional additives such as plasticizers, crosslinking agents, and antioxidants can be used, if necessary, for either the heat sensitive type or the pressure sensitive type. Suitable tackifiers for use herein include, for example, rosin family resins such as rosin, hydro-rosin, ester gum, and maleic acid-modified rosin, petroleum resin, xylene resin, and cumarone-indene resin. These tackifiers may be used alone or as a mixture thereof.

For compounding materials for the adhesive film, a mixture of the polymer and additives, which are used as required, is either dissolved in a solvent or fused to liquid form, and mixed with electroconductive particles by a conventional method such as stirring. Thus, an electroconductive adhesive composition is obtained.

In this case, a surfactant, for example, can be used, if required, as a dispersing agent for the electroconductive particles.

The above electroconductive adhesive composition can be coated on paper, plastic film, or the like, which is coated with a separator if necessary for helping the later separation of the adhesive film, by means of a roll coater or the like, followed by drying, or by hot melt coating to give an electroconductive adhesive film. In the case of the heat sensitive type that does not exhibit stickiness at room temperature, the adhesive layer alone without using such a separator can be wound up into a roll or folded up.

The thickness of the adhesive film is decided by considering the relation to the diameter of the electroconductive particles used and characteristics of the film.

That is, the thickness needs to be at least 110% of the particle size of the electroconductive particles in order to hold the particles satisfactorily in the adhesive. If the thickness is less than 110%, some of the electroconductive particles will be protected not completely with the adhesive, and in consequence will be oxidized or corroded, thereby the electrical conductivity being deteriorated. Also from the viewpoint of characteristics of the adhesive film, the thickness is required in the range of preferably 5 to 100 μm, particularly preferably 5 to 50 μm. When the thickness is less than 5 μm, no sufficient adhesiveness is obtained, and the thickness more than 100 μm is impractical since a large amount of electroconductive particles need to be mixed in order to secure sufficient electrical conductivity with such a thick film.

One or both sides of the formed adhesive film may be covered with separator films if necessary for the purpose of protecting from the adherence of dust or the like. The adhesive film, when both sides thereof are covered with separator films, can be continuously wound up into a roll or folded up.

The thus obtained adhesive film has good transparency. Transparent adhesive films are advantageous in that quality control in the production process is easy to practice in the assembly of display devices or the like, such structures thereof can be designed that the objects to bond can be seen through in bonding operations, and the adjustment of relative positions (hereinafter this adjustment is referred to as registration) for bonding circuits is facilitated and thereby the film application can be automated.

For connecting a pair of circuits by using the adhesive film, the following facilities and techniques can be used. In the case of the heat sensitive type of adhesive film, the film is preliminarily attached onto all the surfaces of connecting terminals on an adherend A, a separator, if present on the film, is peeled off, the connecting terminals on the other adherend B are placed on the film face to face, and the bonding is accomplished with a hot press or heat roll.

In the case of the pressure sensitive type, conventional bonding techniques such as compression between rolls can be adopted.

The anisotropic-electroconductive film according to the invention has a total light transmittance of at least 40% as measured in accordance with JIS K-6714. This is favorable since optical registration of the portions to be bonded together is possible when at least one of the circuit boards is a flexible printed circuit board that comprises a circuit formed on a transparent film.

The invention is illustrated in further detail referring to the following Examples. In the Examples, "parts" and "%" are by weight unless otherwise noted; the compounding proportions for adhesives are expressed in terms of solids; results obtained are all shown in Tables 1 and 2; referring to metal particle sizes, the aspect ratio of the specimen was determined from the respective mean values of the maximum diameters and minimum diameters measured by a scanning electron microscope on 10 or more of the specimen particles; and the particle size was represented by the mean value of said maximum diameters.

EXAMPLES 1 AND 2

An ethylene-vinyl acetate copolymer (mfd. by Mitsui Polychemicals Co., Ltd. under the tradename of Elvax 560; vinyl acetate content 4%, MI 3.5) and a rosin-base tackifier (mfd. by The Japanese Geon Co., Ltd. under the tradename of Quinton B-170; softening point 70° C.) were each dissolved in toluene, respectively, to a concentration of 20%.

Both the solutions (100 parts and 100 parts) were mixed, and in two portions of this mixture were added silver-coated glass beads (mfd. by Toshiba-Ballotini Co., Ltd. under the tradename of Silver Beads S-3000S-3; spherical shape, particle size 45 μm, aspect ratio 0.95) to different concentrations. The mixtures were stirred to prepare adhesive compounded liquids. Each compounded liquid was applied on a separator film (a 25-μm thick poly(ethylene terephthalate) film surface-treated with a silicone) by means of bar coater so as to give a dry thickness of 50 μm. The coats were dried at 120° C. for 3 minutes to remove toluene to form adhesive films. A metal plate (SUS.430BA, 500 μm thick) and a copper foil 35 μm thick were bonded together with each adhesive film thus obtained. That is, each adhesive film was applied on one SUS-430BA sheet, the separator film was peeled off and one copper foil was bonded onto the stripped surface of the adhesive by using a pair of heat rolls (heated to 120° C.). Properties of the films and results of the bonding are shown in Table 1.

From these results, it is proved that adhesive strength and thickness-directional conductivity sufficient for practical use could be obtained by simple bonding operation using the above films. In addition, these films were found to have considerably high transparency, that is, the total light transmittance was 40% or more, since contents of the electroconductive particle were low.

COMPARATIVE EXAMPLE 1

An adhesive film was prepared in the same manner as in Examples 1 and 2 except that the content of the electroconductive particle was increased to 20% by volume.

In this case, the adhesiveness was by far inferior though the conductivity was good. The total light transmittance of the adhesive film was 20% and the low clarity was also ascertained by visual observation.

EXAMPLES 3 TO 5

Adhesive films were prepared by following the procedure of Examples 1 and 2, but the materials used and the thickness of the coats were varied and the coating was carried out by means of a hot-melt applicator (without using any solvent).

That is, a styrene-butadiene block copolymer (mfd. by Asahi Chemical Industry Co., Ltd. under the tradename of Toughprene A, hereinafter designated as SBR; MI 2.6) and an aromatic tackifier (mfd. by Mitsui Petrochemical Industries, Ltd., tradename, Petrosin #150; softening point 150° C.) were employed. The compounding ratio of the SBR to the tackifier was 100 parts: 50 parts. The conductive particle used was a nickel powder (mfd. by International Nickel Co. under the tradename of Carbonyl 123; spherical shape, average particle size 4.5 $\mu$m, fine projections and depressions were present throughout the surface, aspect ratio 0.70).

The SBR and the tackifier (the above compounding ratio) were fed into a melt mixer attached to the hot-melt application and were melted by heating. Said conductive particle was added to the melt, and coating films of different thicknesses were prepared. The evaluation of the thus prepared adhesive films was conducted in the same manner as in Examples 1 and 2 except that the application of films for bonding was carried out with a hot press (temperature of object: 160° C., pressure 2 kg/cm$^2$, press time 5 seconds). All the obtained adhesive films showed considerably high transparency.

Results of the evaluation, as shown in Table 1, indicated that all the films had high adhesive strength and exhibited low resistance characteristics.

The resistivities in the plane direction were higher by several orders than those in the thickness direction, showing high anisotropy in electroconductivity.

COMPARATIVE EXAMPLE 2

An adhesive film was prepared in the same manner as in Examples 3 to 5 except that the thickness of the coat was made 150 $\mu$m. The resistivity in the thickness direction was as high as $10^8$ $\mu$-cm. The adhesive film showed considerably low transparency.

CONPARATIVE EXAMPLE 3

An adhesive film was prepared by following the procedure of Example 4 but using a flaky nickel powder (thickness 0.6 $\mu$m, largest diameter ca. 40 $\mu$m, aspect ratio 0.015).

The film showed a very low adhesive strength and a nearly isotropic electroconductivity.

EXAMPLE 6

To a toluene solution of an adhesive compound of 100 parts of a natural rubber (grade 1, masticated for 30 minutes) and 30 parts of a polyterpene resin (softening point 100° C.), was added 2% by volume of an aluminum powder (mfd. by Toyo Aluminum Co., Ltd. under the tradename of AC-2500; oval shape, particle size 30 $\mu$m, aspect ratio 0.5), and the mixture was well stirred.

In the same manner as in Examples 1 and 2, this mixture was applied on a separator film of 100 $\mu$m in total thickness which had been prepared by coating a glassine paper substrate with a polyethylene layer and treating the surface of the polyethylene layer with a silicone. The coated separator was dried, giving an adhesive film 40 $\mu$m thick.

Using this adhesive film, a 500-$\mu$m thick stainless steel sheet (SUS 430BA) and a 35-$\mu$m thick copper foil were bonded together by compressing with a pair of rubber rolls.

In this case the adhesive film showed high stickiness at room temperature and could be applied with simple operation. The resulting resistivity in the thickness direction was as low as $10^{-2}$ $\Omega$-cm.

The adhesive film was considerably transparent, that is, the total light transmittance was 70%.

EXAMPLE 7

An adhesive compound composed of 100 parts of an acrylic polymer (mfd. by Toagosei Chemical Industry Co., Ltd. tradename, Aron S-1511) and of 1 part of a crosslinking agent (mfd. by Nippon Polyurethane Co., Ltd. under the tradename of Colonate L) was mixed with 5% by volume of a silver powder (supplied by Fukuda Metal Foil Co., Ltd. under the tradename of Silcoat Ag. C-BOB; spherical shape, particle size 1.9 $\mu$m, aspect ratio 0.5). From this mixture an adhesive film 10 $\mu$m thick was prepared and evaluated in the same manner as in Example 6.

The film showed high stickiness and could be applied simply at room temperature by using a pair of rubber rolls. The resulting resistivity in the thickness direction was as low as $10^{-3}$ $\Omega$-cm, and the transparency was sufficient was as low as 10 for practical use.

In addition, the crosslinking agent incorporated into the adhesive gave high cohesion, that is, high heat resistance to the adhesive film.

TABLE 1

| Example No. | Content of electroconductive particles (vol. %) | Thickness of adhesive film ($\mu$m) | Resistivity ($\Omega$-cm) Thickness direction | Resistivity ($\Omega$-cm) Plane direction | Adhesive strength (kg/cm) | Total light transmittance (%) |
| --- | --- | --- | --- | --- | --- | --- |
| Ex. 1 | 0.1 | 50 | $1 \times 10^2$ | $3 \times 10^8$ | 2.4 | 70 |
| Ex. 2 | 10 | 50 | $5 \times 10^{-2}$ | $4 \times 10^6$ | 1.8 | 40 |
| Com. Ex. 1 | 20 | 50 | $3 \times 10^{-3}$ | $3 \times 10^{-2}$ | 0.1 | 20 |
| Ex. 3 | 2 | 5 | $4 \times 10^{-3}$ | $5 \times 10^8$ | 0.9 | 85 |
| Ex. 4 | 2 | 30 | $2 \times 10^{-1}$ | $7 \times 10^9$ | 2.1 | 70 |
| Ex. 5 | 2 | 100 | $6 \times 10^3$ | $3 \times 10^{10}$ | 2.8 | 50 |
| Com. Ex. 2 | 2 | 150 | $7 \times 10^8$ | $4 \times 10^{11}$ | 3.2 | 30 |
| Com. Ex. 3 | 2 | 30 | $2 \times 10^3$ | $4 \times 10^3$ | 0.2 | 40 |
| Ex. 6 | 3 | 40 | $1 \times 10^{-2}$ | $5 \times 10^9$ | 0.8 | 70 |

TABLE 1-continued

| Example No. | Content of electroconductive particles (vol. %) | Thickness of adhesive film (μm) | Resistivity (Ω-cm) | | Adhesive strength (kg/cm) | Total light transmittance (%) |
| --- | --- | --- | --- | --- | --- | --- |
| | | | Thickness direction | Plane direction | | |
| Ex. 7 | 5 | 10 | $1 \times 10^{-3}$ | $1 \times 10^3$ | 0.4 | 60 |

Test methods for the characteristics shown in Table 1 were as follows:

(1) Resistivity in the thickness direction: A stainless steel sheet (SUS-430 BA) and an aluminum foil of 0.5 cm² in surface area were bonded together through an adhesive film specimen so that the edge effect would be eliminated, the resistance of the adhesive film in the thickness direction was measured, and the found value was converted into volume resistivity.

(2) Resistivity in the plane direction: An adhesive film specimen was bonded onto an insulating polyester film of 50 μm in thickness, the resistance of the film in the plane direction was measured at a specimen width of 0.5 cm with the space between the electrodes being set to 0.5 cm, and the found value was converted into volume resistivity.

For converting the found resistance into volume resistivity in the above (1) and (2), the following equation was used:

$$\rho = (SR/l)$$

wherein ρ: volume resistivity (Ω-cm),
S: cross-sectional area of specimen (cm²),
R: found value of resistance (Ω), and
l: space between electrodes (cm).

(3) Adhesive strength: The 180°-degree peeling method in accordance with JIS Z-0237 was applied. The measurement was conducted at a peeling speed 50 mm/min., 20° C., and 65% RH by using a copper foil bent by 90° degree.

(4) Total light transmittance: This was measured in accordance with JIS K-6714 using a digital turbidimeter (Model NDH-20D of Nippon Denshoku Kogyo K.K.).

EXAMPLES 8 TO 11 AND COMPARATIVE EXAMPLES 4 AND 5

The same ethylene-vinyl acetate copolymer and the same rosin-base tackifier (softening point 70° C.) as used in Example 1 were dissolved in equal amounts in toluene to prepare solutions of concentration 20%. A nickel powder (particle shape: spherical, average particle size: 4.5 μm, aspect ratio: 0.70) having fine projections and depressions was mixed in the proportions shown in Table 2 with the above solutions. The mixtures were each ball-milled for 24 hours to give adhesive compounded liquids. Each compounded liquid was applied on a 25-μm thick polyester film surface-treated with a releasing agent by means of a bar coater so as to give a dry thickness of 30 μm, and was dried at 120° C. for 3 minutes to remove the toluene. In this way, adhesive films of different electroconductive particle contents were obtained. Using each adhesive film, two flexible polyester circuit boards (pitch of circuit lines: 0.1 mm, line width 0.05 mm) were coupled together by opposing the boards through the adhesive film, registering the circuits, and bonding together each pair of opposing lines by compressing a pair of heat rolls (120° C.). Characteristics of the thus coupled circuits are shown in Table 2.

These results revealed that bond strength and thickness-directional conductivity both sufficient for practical use could be obtained with simple bonding operation using the films containing the conductive particles in concentrations of 0.1 to 10.0% by volume.

In addition, these films were found to have considerably high transparency, that is, the total light transmittance was 40% or more, since contents of the conductive particles were low.

COMPARATIVE EXAMPLE 6

An adhesive film was prepared in the same manner as in Example 10 but using a flaky nickel powder (particle shape: flaky, thickness 0.6 μm, largest diameter ca. 40 μm, aspect ratio 0.015).

The film showed a very low bond strength and a nearly isotropic electroconductivity.

EXAMPLE 12

To a toluene solution of an adhesive compound of 100 parts of a natural rubber (grade 1, masticated for 30 minutes,) and 30 parts of a polyterpene resin (softening point 100° C.), was added 2% by volume of an aluminum powder (particle shape: oval, particle diameter 10 μm, aspect ratio 0.5), and the mixture was well stirred.

In the same manner as in Example 8, this mixture was applied on a separator film of 100 μm in total thickness which had been prepared by coating a glassine paper substrate with a polyethylene layer and treating the surface of the polyethylene layer with a silicone. The coated separator was dried, giving an adhesive film 20 μm thick.

Using this adhesive film, two flexible circuit boards (pitch of circuit lines: 0.2 mm, line width: 0.1 mm) were coupled together in the same manner as in Example 8.

In this case, the adhesive film showed high stickiness at room temperature and could be applied with simple operation. The resulting resistivity in the thickness direction was as low as $10^{-1}$ Ω-cm.

The adhesive film was considerably transparent, that is, the total light transmittance was 70%.

EXAMPLE 13

An adhesive compound composed of 100 parts of an acrylic polymer and of 1 part of an isocyanate type crosslinking agent was mixed with 10% by volume of a silver powder (particle shape: spherical, particle size 0.5 μm, aspect ratio 0.9). From this mixture, an adhesive film 10 μm thick was prepared and evaluated in the same manner as in Example 12.

The film showed high stickiness and could be applied simply at room temperature by using a pair of rubber rolls. The resulting resistivity in the thickness direction was $10^{-3}$ Ω-cm, and the transparency was sufficient for practical use.

In addition, the crosslinking agent incorporated into the adhesive gave high cohesion, that is, high heat resistance to the adhesive film.

TABLE 2

| Example No. | Electroconductive particles | | | Thickness of adhesive film (μm) | Resistivity (Ω-cm) | | Adhesive strength (kg/cm) | Total light transmittance (%) |
| --- | --- | --- | --- | --- | --- | --- | --- | --- |
| | Particle size (μm) | Aspect ratio | Amount added (vol. %) | | Thickness direction | Plane direction | | |
| Com. Ex. 4 | 4.5 | 0.7 | 0.05 | 30 | $3 \times 10^6$ | $5 \times 10^9$ | 1.2 | 85 |
| Ex. 8 | " | " | 0.1 | " | $7 \times 10^2$ | $1 \times 10^8$ | 1.3 | 85 |
| Ex. 9 | " | " | 2.0 | " | $2 \times 10^{-1}$ | $8 \times 10^7$ | 1.0 | 69 |
| Ex. 10 | " | " | 5.0 | " | $5 \times 10^{-2}$ | $4 \times 10^7$ | 0.8 | 63 |
| Ex. 11 | " | " | 10.0 | " | $1 \times 10^{-2}$ | $5 \times 10^6$ | 0.6 | 44 |
| Com. Ex. 5 | " | " | 20.0 | " | $2 \times 10^{-3}$ | $5 \times 10^0$ | 0.2 | 30 |
| Com. Ex. 6 | 40 | 0.015 | 5.0 | " | $2 \times 10^3$ | $6 \times 10^3$ | 0.1 | 41 |
| Ex. 12 | 10 | 0.5 | 2.0 | 20 | $1 \times 10^{-1}$ | $5 \times 10^7$ | 0.7 | 70 |
| Ex. 13 | 0.5 | 0.9 | 10.0 | 10 | $1 \times 10^{-3}$ | $1 \times 10^7$ | 0.3 | 45 |

As described in detail hereinbefore, the anisotropic-electroconductive adhesive film according to the present invention exhibits sufficient anisotropic electroconductivity due to a specified electroconductive particle mixed and has high bond strength since the content of the particle is as low as 0.1 to 10% by volume.

Since the adhesive film is available in sheet or film form, a stable electrical conductivity can be constantly obtained, bonding operation therewith is simple and can be completed in a short time, thus a considerable reduction in process time being possible. Moreover, there is no hazard of environmental pollution since bonding operation with this film is feasible without using any solvent. Furthermore, this film has good transparency due to the low content of the electroconductive particle. Accordingly, connection of circuits with visual observation is possible with this film.

What is claimed is:

1. An adhesive film capable of exhibiting anisotropic-electroconductivity by applying pressure or pressure and heat to each of its major surfaces, said film comprising a polymeric adhesive component in the form of a film and electroconductive particles dispersed in the adhesive component in an amount of 0.1 to 10% by volume, said film being formed by cast molding a solution containing the adhesive component, the electroconductive particles and a solvent and thereafter evaporating the solvent, said electroconductive particles having an average particle size of 1 to 10 μm, with a ratio of the minimum particle diameter to the maximum particle diameter of each particle being 0.5 to 1.0, and the thickness of the film being not more than 50 μm, said adhesive film exhibiting a total light transmittance of 40% or more and electroconductivity only in the thickness direction thereof upon the application of pressure or pressure and heat to said major surfaces.

2. An adhesive film according to claim 1, wherein the electroconductive particles have a specific resistance of $10^{-5}$ Ω-cm or less.

3. An adhesive film according to claim 1, wherein the adhesive film has a resistivity of at least $10^6$ Ω-cm in a direction parallel to the film surface and a resistivity of not more than $10^3$ Ω-cm in a direction perpendicular to the film surface.

4. An adhesive film according to claim 1, wherein the adhesive component is an electric insulator.

5. An adhesive film according to claim 1, wherein the adhesive film has a resistivity in the direction along the film layer of $10^6$ Ω-cm or more, a minimum insulating width of 0.05 mm, a resistivity in the direction of thickness of $10^3$ Ω-cm or less, and an adhesive strength of 30 or more.

6. An adhesive film according to claim 1, wherein the electroconductive particles are particles of Ni, Fe, Cr, Co, Al, Sb, Mo, Cu, Ag, Pt, Au or a mixture thereof, or glass or plastic particles coated with these metals.

7. An adhesive film according to claim 1, wherein the adhesive component is a heat-sensitive adhesive component containing a thermoplastic polymer as a main component.

8. An adhesive film according to claim 7 wherein the thermoplastic polymer is an ethylene-vinyl acetate copolymer, a polyethylene, an ethylene-propylene copolymer, an ethylene-acrylate copolymer, an acrylic rubber, a polyisobutylene, an atactic polypropylene, a poly(vinyl butyral), a styrene-butadiene copolymer, a polybutadiene, ethyl-cellulose, a polyamide, a polyurethane or a mixture thereof.

9. An adhesive film according to claim 1, wherein the adhesive component is a pressure-sensitive adhesive component containing a polymer having stickiness at room temperature.

10. An adhesive film according to claim 9, wherein the polymer is an acrylic rubber, natural rubber, a silicone rubber, a polychloroprene, a butadiene-styrene copolymer, an ethylene-vinyl acetate copolymer, a polyisobutylene, a poly(vinyl ether) rubber, or a mixture thereof.

* * * * *